United States Patent
Donolo

(10) Patent No.: US 10,054,641 B2
(45) Date of Patent: Aug. 21, 2018

(54) MONITORING SYNCHRONIZATION OF A MOTOR USING STATOR CURRENT MEASUREMENTS

(71) Applicant: Schweitzer Engineering Laboratories, Inc., Pullman, WA (US)

(72) Inventor: Marcos A. Donolo, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 776 days.

(21) Appl. No.: 14/033,269

(22) Filed: Sep. 20, 2013

(65) Prior Publication Data

US 2015/0088444 A1  Mar. 26, 2015

(51) Int. Cl.
*G01R 31/34* (2006.01)
*G01R 19/25* (2006.01)
*H02P 21/18* (2016.01)

(52) U.S. Cl.
CPC ....... *G01R 31/343* (2013.01); *G01R 19/2513* (2013.01); *H02P 21/18* (2016.02)

(58) Field of Classification Search
CPC ...... H02J 3/42; H02P 1/50; H02P 5/46; H02P 5/50; H02P 23/14
See application file for complete search history.

(56) References Cited

U.S. PATENT DOCUMENTS

| | | | |
|---|---|---|---|
| 2,205,253 A | 6/1940 | Gulliksen | |
| 3,408,547 A | 10/1968 | Saeger | |
| 3,818,294 A | 6/1974 | Glukhov | |
| 4,218,718 A | 8/1980 | Sun | |
| 4,547,826 A | 10/1985 | Premerlani | |
| 4,743,818 A | 5/1988 | Quayle | |
| 4,761,703 A | 8/1988 | Kliman | |
| 4,914,386 A | 4/1990 | Zocholl | |
| 5,030,917 A | 7/1991 | Kliman | |
| 5,086,264 A | 2/1992 | Kelledes | |
| 5,436,784 A | 7/1995 | Schweitzer | |
| 5,539,601 A | 7/1996 | Farag | |
| 5,548,197 A | 8/1996 | Unsworth | |

(Continued)

FOREIGN PATENT DOCUMENTS

WO  2013004285  1/2013

OTHER PUBLICATIONS

Steven R. Shaw and Steven B. Leeb; "Identification of Induction Motor Parameters from Transient Stator Current Measurements;" Feb. 1999; IEEE Transactions Industrial Electronics; vol. 46, No. 1, pp. 139-149.*

(Continued)

*Primary Examiner* — Mischita Henson
*Assistant Examiner* — Christine Liao
(74) *Attorney, Agent, or Firm* — Richard M. Edge

(57) ABSTRACT

Monitoring synchronization of an electric motor using current signals from power supplied to the motor is disclosed herein. The current signals may be used to calculate representative current values which may be used to calculate a rotational frequency of the rotor of the motor. The rotational frequency may be used to determine synchronization, such as slip. Monitoring may be during startup of a synchronous motor in induction mode. Upon reaching a predetermined synchronization threshold, the motor may be configured from induction mode to synchronous mode.

11 Claims, 5 Drawing Sheets

(56) References Cited

U.S. PATENT DOCUMENTS

| | | |
|---|---|---|
| 5,644,510 A | 7/1997 | Weir |
| 5,684,342 A | 11/1997 | Innes |
| 5,706,153 A | 1/1998 | Innes |
| 5,726,911 A | 3/1998 | Canada et al. |
| 5,761,018 A | 6/1998 | Blakely |
| 5,793,595 A | 8/1998 | Schweitzer |
| 5,852,351 A | 12/1998 | Canada et al. |
| 5,856,903 A | 1/1999 | Smith |
| 5,872,722 A | 2/1999 | Oravetz |
| 6,042,265 A | 3/2000 | Kiliman |
| 6,138,078 A | 10/2000 | Canada et al. |
| 6,172,509 B1 | 1/2001 | Cash |
| 6,297,742 B1 | 10/2001 | Canada et al. |
| 6,308,140 B1 | 10/2001 | Dowling |
| 6,356,421 B1 | 3/2002 | Guzman-Casillas |
| 6,456,946 B1 | 9/2002 | O'Gorman |
| 6,757,146 B2 | 6/2004 | Benmouyal |
| 6,975,946 B2 | 12/2005 | Al-Hamrani |
| 7,065,437 B2 | 6/2006 | Mir |
| 7,123,457 B2 | 10/2006 | Schweitzer |
| 7,161,778 B2 | 1/2007 | Zocholl |
| 7,336,455 B2 | 2/2008 | Dimino |
| 7,675,720 B1 | 3/2010 | Zocholl |
| 8,080,964 B2 | 12/2011 | Hudson |
| 8,232,760 B2 | 7/2012 | Lu |
| 8,356,003 B2 | 1/2013 | Chen |
| 8,484,150 B2 | 7/2013 | Sparling |
| 2003/0076064 A1 | 4/2003 | Kleinau |
| 2003/0076065 A1 | 4/2003 | Shafer |
| 2003/0171895 A1* | 9/2003 | Harris ............... G05B 23/0227 702/183 |
| 2004/0260488 A1 | 12/2004 | Al-Hamrani |
| 2004/0264073 A1 | 12/2004 | Zocholl |
| 2005/0043873 A1 | 2/2005 | Mir |
| 2005/0151494 A1 | 7/2005 | Lelkes |
| 2006/0232237 A1 | 10/2006 | Jadot |
| 2006/0250102 A1 | 11/2006 | Payne |
| 2006/0290316 A1* | 12/2006 | Seguchi ............... H02K 19/28 318/720 |
| 2007/0078614 A1* | 4/2007 | Discenzo ........... G05B 19/4062 702/60 |
| 2007/0132446 A1 | 6/2007 | Kleinau |
| 2007/0182359 A1 | 8/2007 | Wahler |
| 2008/0018288 A1 | 1/2008 | Malrait |
| 2008/0258672 A1 | 10/2008 | Osman |
| 2008/0315811 A1 | 12/2008 | Hudson |
| 2009/0284212 A1* | 11/2009 | Turner ................... H02P 23/14 318/767 |
| 2009/0315329 A1* | 12/2009 | Duffey ................. H02K 16/02 290/44 |
| 2010/0060227 A1 | 3/2010 | Zocholl |
| 2010/0194329 A1* | 8/2010 | Lu ........................ H02P 21/16 318/798 |
| 2010/0214709 A1 | 8/2010 | Hall |
| 2010/0301792 A1 | 12/2010 | Tiwari |
| 2010/0315033 A1 | 12/2010 | Lu |
| 2011/0194318 A1 | 8/2011 | Kono |
| 2011/0213744 A1 | 9/2011 | Sparling |
| 2011/0279076 A1 | 11/2011 | Hirt |
| 2011/0313717 A1 | 12/2011 | Lu |
| 2012/0001580 A1* | 1/2012 | Zhang ................. G01R 31/343 318/490 |
| 2012/0056570 A1 | 3/2012 | Hudson |
| 2012/0217908 A1 | 8/2012 | Wu |
| 2012/0265457 A1 | 10/2012 | Donolo |
| 2012/0280645 A1 | 11/2012 | Olsson |
| 2013/0088799 A1 | 4/2013 | Zeller |
| 2013/0107400 A1 | 5/2013 | Meng |
| 2013/0314822 A1 | 11/2013 | Dio |

OTHER PUBLICATIONS

David Manney; "What Is Induction Motor Slip?"; L&S Electric; Watts New blog; http://www.lselectric.com/what-is-induction-motor-slip; pp. 1-3.*

Stanley E. Zocholl, Schweitzer Engineering Laboratories, Inc.—Tutorial: From Steinmetz Model to the Protection of High Inertia Drives, Oct. 2006.

E.O. Schweitzer, III, S.E. Zocholl, Aspects of Overcurrent Protection for Feeders and Motors, May 1994.

Stanley E. Zocholl, Comparing Motor Thermal Models, 2003.

Patrick Whatley, Mark Lanier, Lee Underwood, Stan Zocholl, Enhanced Motor Protection with the Slip-Dependent Thermal Model: A Case Study, Sep. 12, 2007.

S.E. Zocholl, Induction Motors: Part I—Analysis, 1996.

S.E. Zocholl, Induction Motors: Part II—Protection, 1996.

Stanley E. Zocholl, Optimizing Motor Thermal Models, Apr. 24, 2006.

Stanley E. Zocholl, Armando Guzman-Casillas, Thermal Models in Power System Protection, 1999.

S.E. Zocholl, Understanding Service Factor, Thermal Models, and Overloads, Oct. 2005.

S.E. Zocholl, Gabriel Benmouyal, Using Thermal Limit Curves to Define Thermal Models of Induction Motors, Oct. 2001.

Ed Lebenhaft, Field Evaluation of Slip-Dependent Thermal Model for Motors with High-Inertia Starting, May 2007.

Ed Lebenhaft, Mark Zeller, Estimating Key Parameters for Protection of Undocumented AC Motors, Mar. 18, 2008.

Ed Lebenhaft, Mark Zeller, Advanced Thermal Motor Protection Using Digital Relays, Oct. 6, 2008.

Benouzza, N., Benyettou, A., Bendiabdellah, A., An Advanced Park's Vectors Approach for Rotor Cage Diagnosis, IEEE First International Symposium on Control, Communications and Signal Processing, Mar. 21-24, 2004.

Cardoso, A.J.M., and Saraiva E.S., Computer-Aided Detection of Airgap Eccentricity in Operating Three-Phase Induction Motors by Park's Vector Approach, IEEE Transactions on Industry Applications, vol. 29, Issue 5, Sep./Oct. 1993.

Didier, G., Ternisien, E., Caspary, O., Razik H., Fault Detection of Broken Rotor Bars in Induction Motor using a Global Fault Index, IEEE Transactions on Industry Applications, vol. 42, Issue 1, Jan. 30, 2006.

Douglas, H., Pillay, P., Ziarani, A., Detection of Broken Rotor Bars in Induction Motors Using Wavelet Analysis, IEEE International Electric Machines and Drives Conference, Jun. 2003.

Stankovic, Dragen, et al., Enhanced Algorithm for Motor Rotor Broken Bar Detection, IEEE Industrial and Commercial Power Systems Technical Conference, May 9-13, 2010.

Kliman, G.B., et al, Noninvasive Detection of Broken Rotor Bars in Operating Induction Motors, IEEE Transactions on Energy Conversion, vol. 3, No. 4, Dec. 1988.

Cardoso, A.J.M., Cruz, S.M.A., Carvalho, J.F.S., Saraiva, E.S., Rotor Cage Fault Diagnosis in Three-Phase Induction Motors, by Park's Vector Approach, IEEE Industry Applications Conference, Oct. 1999

Cruz, S.M.A., Cardoso, A.J.M., Stator Winding Fault Diagnosis in Three-Phase Synchronous and Asynchronous Motors, by the Extended Park's Vector Approach, IEEE Transactions on Industry Applications, vol. 37, No. 5, Sep./Oct. 2001.

Williamson, S., and Smith, A.C., Steady-State Analysis of 3-Phase Cage Motors with Rotor-Bar and End-Ring Faults, IEE Proc. vol. 129, Pt.B, No. 3, May 1982.

PCT/US2014/051848 Patent Cooperation Treaty, International Search Report and Written Opinion of the International Searching Authority, dated Dec. 18, 2014.

* cited by examiner

MONITORING SYNCHRONIZATION OF A MOTOR USING STATOR CURRENT MEASUREMENTS

RELATED APPLICATION (none)

TECHNICAL FIELD

This disclosure relates to using current measurements to monitor synchronization of a motor. This disclosure also relates to monitoring synchronization of a synchronous motor starting in an induction mode.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Electric motors are used in many industrial and utility processes to convert electrical energy into mechanical energy useful in a process. Typically, electric motors may be induction motors or synchronous motors. Induction motors generally include a stator with windings in electrical communication with an alternating current ("AC") electric power source such that a rotating magnetic field is produced by electric current through the stator windings, as well as a rotor induction windings wherein an electrical current is induced by the rotating magnetic field. The rotor is caused to rotate due to the rotating magnetic field of the stator and a resultant magnetic field from the induced current in the rotor windings. Because torque generation depends on a difference between the rotational speed of the stator's magnetic field and the rotor's mechanical rotational speed, induction motors exhibit some degree of slip in operation. Slip may be referred to as a ratio of the difference between synchronous speed (a speed at which the rotor rotates at a frequency equal to the rotating magnetic field frequency of the stator) and the operating speed, to the synchronous speed. For a slip of 1, the rotor frequency is zero. For a slip of zero, the rotor rotates synchronously with the magnetic field induced by the stator. After startup, and depending on the attached load, induction motors may operate from around 5% slip to around 0.5% slip.

Synchronous motors similarly include a stator with windings in electrical communication with an AC electric power source such that a rotating magnetic field is produced by current through the stator windings, as well as a rotor. However, the rotor of a synchronous electric motor is magnetized by non-excited magnetization (e.g. permanent magnets) or excited magnetization using a direct current ("DC") through windings of the rotor. Because the magnetic field of the rotor is not induced by the rotating magnetic field of the stator, the rotor is capable of operating synchronously with the rotating magnetic field of the stator. That is, in operation after startup, synchronous motors may operate at a slip value of 0%.

Figure 1:
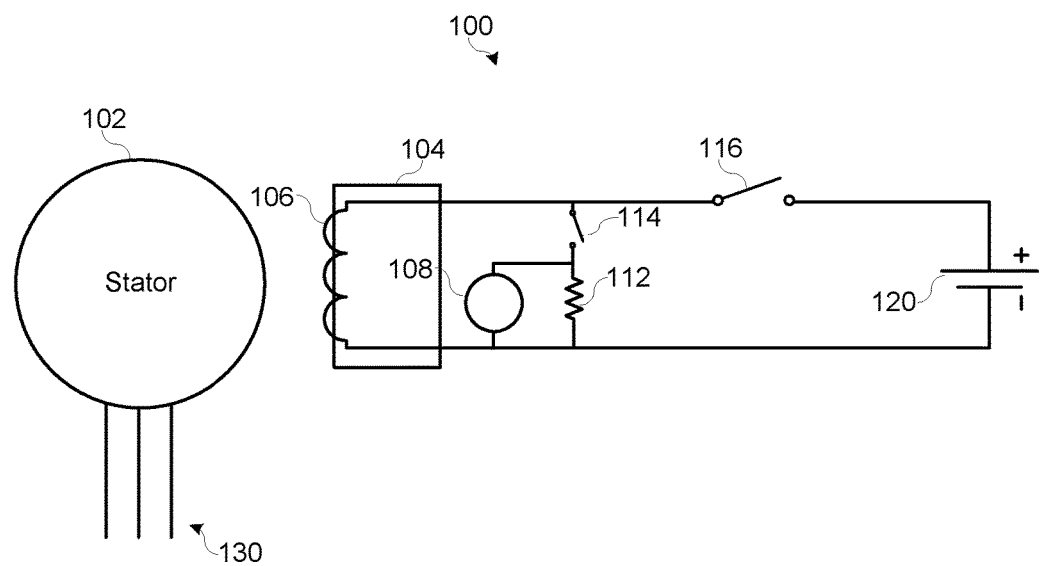
FIG. 1 is a block diagram of a synchronous motor and field winding electric supply circuitry.

Certain synchronous motors may not be capable of starting from standstill in synchronous mode. The inertia of the rotor may be too great for the rotor to follow the rotating magnetic field of the stator. Accordingly, synchronous motors may be configured to start in an induction mode and later reconfigured to synchronous mode. FIG. 1 illustrates an electrical block diagram of a synchronous motor 100 capable of being started as an induction motor and subsequently reconfigured as a synchronous motor. As briefly described above, the rotor 104 of a synchronous motor 100 may include windings 106 in electrical communication with a DC electric power source 120 to induce a magnetic field in the windings 106 of the rotor 104, that is stationary with respect to the rotor 104. These windings 106 may be disconnected from the DC power source 120 used to induce the permanent magnetic field by opening switch 116, and instead shorted using a discharge resistor 112 by closing switch 114. With the shorted windings 106, the motor 100 may act as an induction motor, with a current being induced in the field windings 106 of the rotor by the magnetic field produced by the stator windings. The stator 102 may include windings in electrical communication with an AC electric power source such as the illustrated 3-phase AC electric power source 130. After the motor 100 is started in induction mode, the motor may be reconfigured to operate in synchronous mode.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module.

Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

Returning now to FIG. 1, at a certain point, the motor 100 should be reconfigured from induction startup mode to synchronous mode by disconnecting discharge resistor 112 by opening switch 114, and connecting DC electric power source 120 by closing switch 116. Thus, the field windings 106 would be reconfigured from induction windings (where the current therethrough is induced by the magnetic field from the stator windings) to windings receiving power from the DC power source 120, resulting in a magnetic field that is stationary with respect to the rotor 104.

In various motors, the reconfiguration may take place a certain predetermined time after startup. The predetermined time may be calculated based on the longest possible start time. That is, at startup a timer may be started. Once the timer expires, switch 114 may be opened and switch 116 may be closed.

In other various motors, a rotational frequency of the rotor may be monitored. When the rotational frequency of the rotor approaches the synchronous frequency switch 114 may be opened and switch 116 may be closed. Rotational frequency of the rotor may be monitored using a voltage across the discharge resistor 112. A voltage measurement device 108 across the discharge resistor 112 may be used to monitor the voltage across the discharge resistor 112. The voltage across the discharge resistor 112 may be monitored for zero-crossings, which may then be used to determine the rotational frequency of the rotor using Equation 1:

$$F_r = 100 \frac{FN - \frac{1}{2\Delta t}}{FN} \qquad 1$$

where:
$F_r$ is the rotational frequency of the rotor;
FN is the nominal frequency of the motor; and,
$\Delta t$ is the time between two consecutive zero crossing of the voltage monitored by the voltage measurement device 108 across the discharge resistor.

Using Equation 1, once $F_r$ approaches a predetermined threshold, the system may reconfigure to synchronous operation. The predetermined threshold may be around 95%.

According to various embodiments disclosed herein, motor synchronization may be monitored without using voltage across a discharge resistor. Thus, according to these embodiments, no additional hardware is needed to monitor slip beyond hardware typically used to monitor the motor. Further, a synchronous motor may be monitored during startup for proper reconfiguration from an induction mode to a synchronous mode when synchronization reaches a predetermined threshold. Synchronization may refer to a degree of synchronization between the rotational frequency of the rotor and the nominal frequency of the motor. In one embodiment, synchronization may be measured using slip. In another embodiment, synchronization may be measured as a ratio of the rotational frequency of the rotor to the nominal frequency of the motor. That is, when synchronization reaches a predetermined threshold, the synchronous motor may be reconfigured from induction mode to synchronous mode during startup.

Reconfiguration from induction mode during startup to synchronous mode may include removing the discharge resistor from the field winding circuit and introducing a DC source to the field winding circuit. The DC source provides current through the field windings, thus producing the magnetic field used for the synchronous motor. One method of accomplishing the removal of the discharge resistor and introduction of the DC source is once synchronization has reached a predetermined threshold, switch 114 may be opened, disconnecting the discharge resistor 112 from the field winding circuit, and switch 116 may be closed such that DC source 120 is introduced to the field winding circuit.

Figure 2:
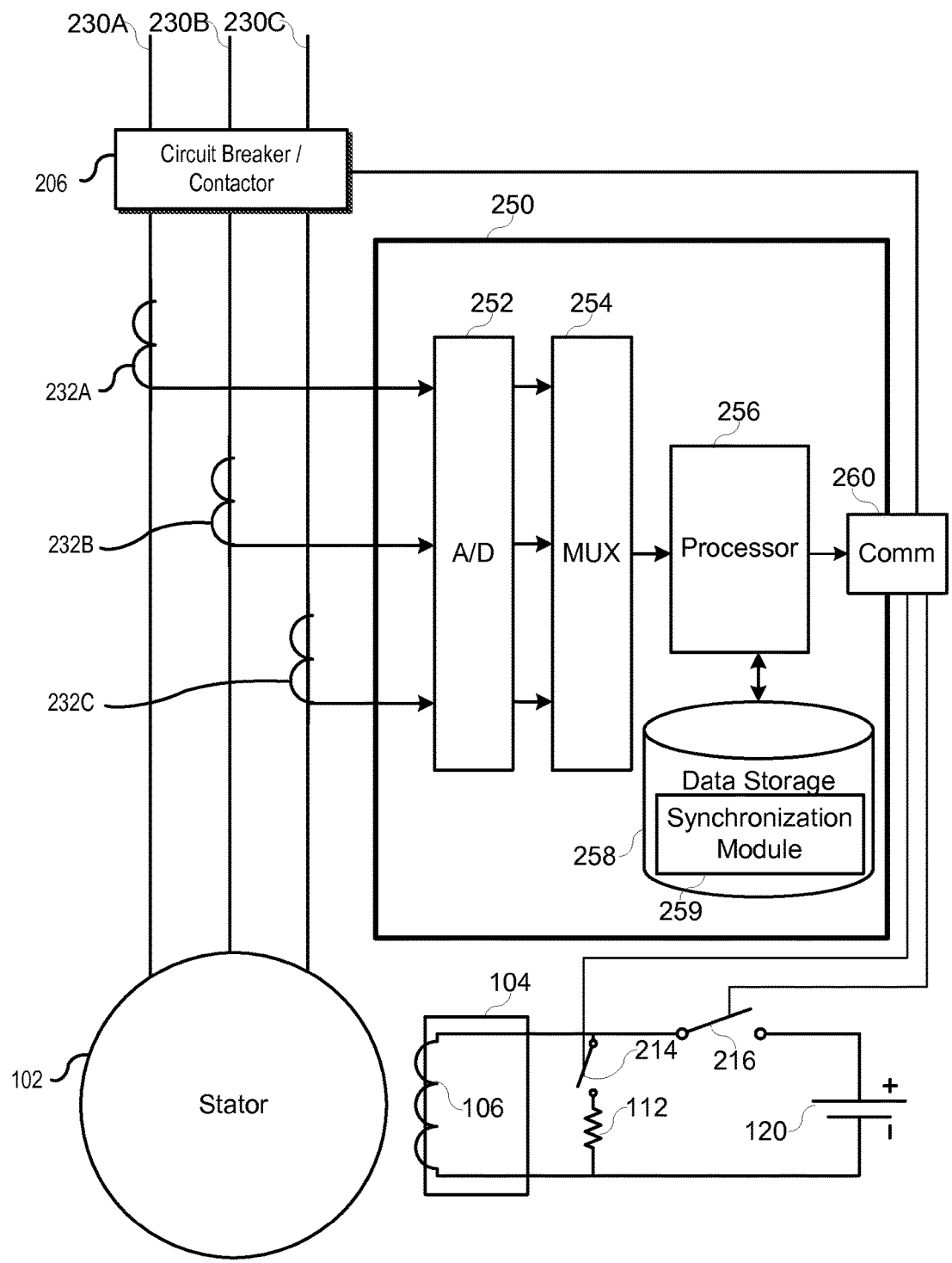
FIG. 2 illustrates a functional block diagram of an intelligent electronic device monitoring a motor.

FIG. 2 illustrates one particular embodiment of an apparatus and system according to the present disclosure. As with FIG. 1, a three phase electric motor that includes a stator 202 and a rotor 204 is monitored by an intelligent electronic device ("IED") 250 which receives current signals from the current to the motor using current transformers ("CTs") 232A, 232B, and 232C. IED 250 may be capable of monitoring and protecting the motor using the methods described herein. Some examples of IEDs that may be used include protective relays, motor protective relays, and the like. The three phase current signals from the CTs 232A, 232B, and 232C may be provided to a processor 256 via various filters (such as low-pass filters, not separately illustrated), an analog-to-digital converter (A/D) 252, and a multiplexor 254. Various other pre-processing devices and steps may be incorporated as desired. These various other pre-processing devices and steps may be performed on a processor or the like. Further, the pre-processing devices and steps may include a sampler (the A/D may function as a sampler) for sampling the signals. The signals representing the currents and voltages from the three phases and temperature from the RTDs are ultimately provided to a processor (such as a microprocessor, microcontroller, application specific integrated circuit (ASIC), field programmable gate array (FPGA), and the like), where the methods described herein are performed. The IED may include data storage 258 (such as a non-transitory computer-readable storage medium) where the particular modules, calculators, and/or computer instructions for operating the present methods may be stored. Further, values calculated by the processor 256 may be stored using the data storage 258. The IED thus contains various calculators and/or modules for making the various calculations described herein, though the various calculators are not separately illustrated.

The data storage 258 may include computer instructions executable by the processor 256 for monitoring the motor. In particular, such computer instructions may be executable for monitoring synchronization of the rotor of the motor as described herein. Such computer instructions may further be executable to open switch 214 and close 216 when synchronization has reached a predetermined threshold. As mentioned above, the motor may be started in induction mode, with the field windings 106 of the rotor 104 disconnected from the DC source 120 and instead closed in series with discharge resistor 112. When the synchronization has reached a predetermined threshold, switch 214 may be opened and switch 216 closed such that discharge resistor 112 is removed from the field winding 106 circuit, and DC power source 120 is introduced into the field winding 106 circuit. Switches 214 and 216 may be operated synchronously such that switch 214 is opened synchronously with the closing of switch 216.

The IED 250 further includes a communication module 260 that is capable of receiving commands from the processor 256 and transmitting such to receiving devices such as circuit breaker 206 and switches 214 and 216. Processor 256 may receive signals from the multiplexor 254. The signals may be digitized analog signals corresponding with current supplied to the windings of the stator 102 by phases 230A, 230B, and 230C, and obtained using CTs 232A, 232B, and 232C. Processor 256 may execute computer instructions stored in data storage 258 to determine synchronization of the motor using the signals from the multiplexor. Processor 256 may monitor a state of the motor using the determined synchronization of the motor. During startup, the computer instructions may include a threshold of synchronization and instructions for an action for the processor to take once it has determined that the synchronization has reached the threshold. For example, if the motor is a synchronous motor and is being started in induction mode, once the synchronization reaches the predetermined threshold, the processor may act to open switch 214 and close switch 216. Processor may send signals to the switches using the communications module 260. Communications module 260 may be any module capable of sending and/or receiving electric signals from the processor 256 to other equipment and devices. Communications module 260 may include one or more various physical interfaces such as, for example, serial or parallel interfaces, contact inputs, contact outputs, or the like. Communications module 260 may include further hardware capable of transforming the signal from the processor 256 for use by downstream equipment or devices, and for transforming signals from devices or equipment for use by the processor 256.

As mentioned above, data storage 258 may include computer instructions executable on the processor 256 for monitoring the motor. The computer instructions may include a synchronization module 259, configured to monitor synchronization of the motor. In one embodiment, the computer instructions may be for monitoring startup of a synchronous motor in an induction mode. The synchronization module may include the computer instructions executable on the processor for estimating a synchronization of the motor using current data from the multiplexor 254 in accordance with the methods described herein. For example, the synchronization module may include computer instructions executable on the processor configured to calculate root-mean squared values from the plurality of current values from the multiplexor, sum the root-mean squared current values, divide the sum by three, subtract a DC component to produce representative current values, determine zero-crossings of the representative current values, and calculate an estimate of synchronization using the zero crossings. The instructions of the synchronization module may further be configured to reconfigure the motor from induction mode to synchronous mode when the synchronization reaches a predetermined threshold, as described in more detail herein.

Figure 3A:
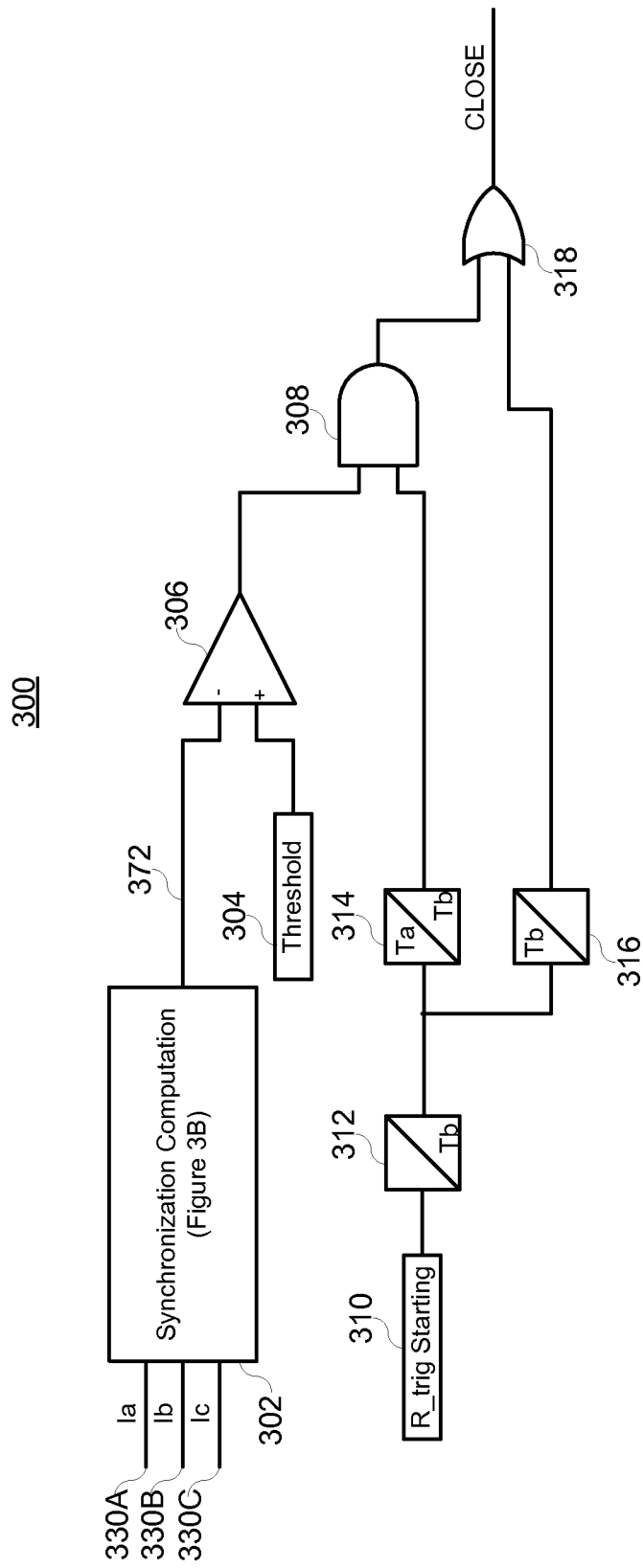
FIGS. 3A and 3B illustrate a logic diagram for monitoring synchronization of a motor.
Figure 3B:
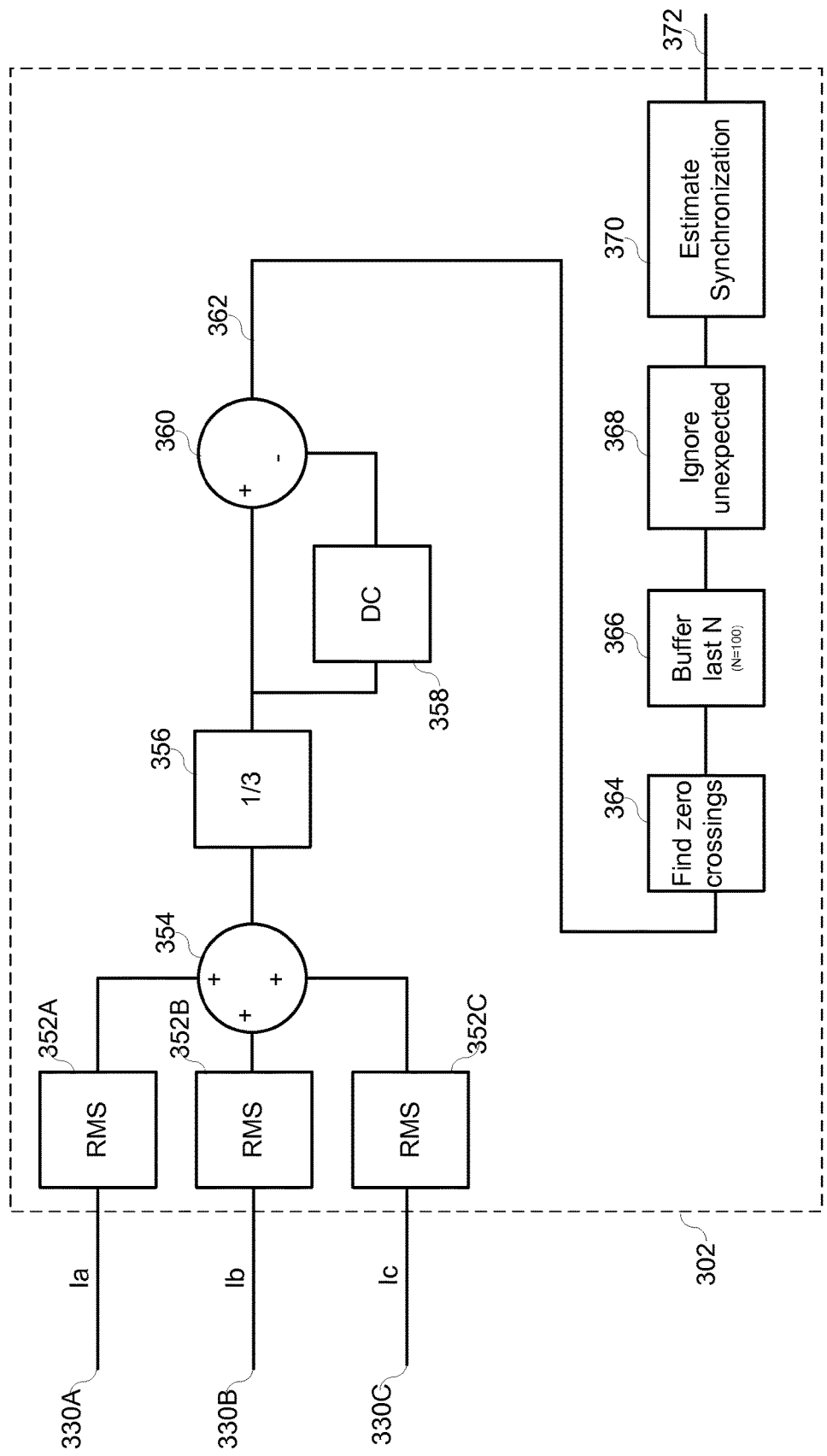

FIGS. 3A and 3B illustrate a simplified block diagram 300 of a logical set of computer instructions that may be stored in the data storage 258 and executed by the processor 256 for monitoring a motor. The computer instructions 300 may receive signals 330A, 330B, and 330C corresponding with currents in each of three phases to the motor. The signals 330A, 330B, and 330C may be digitized analog signals obtained using CTs as discussed above, and multiplexed before being communicated to the processor 256. The signals may be used to calculate a synchronization of the motor 302, discussed in more detail below in conjunction with FIG. 3B. The synchronization of the motor may be compared against a predetermined threshold 304 by comparator 306. As discussed above, the synchronization calculated by 302 may include slip, and the threshold may include a slip threshold. The slip threshold may be around 0.05. In another embodiment, the synchronization of the motor may be a ratio of the rotational frequency of the rotor to the nominal frequency of the motor. The threshold may be around 0.95. When the calculated synchronization reaches the predetermined threshold 304 (in terms of slip, when the slip falls below the threshold, and in terms of the ratio, when the ratio exceeds the threshold), then comparator 306 signals the AND gate 308, which, in turn, signals the OR gate 318.

Logic 300 also triggers 310 a timer 312 upon starting of the motor. The timer is configured such that Ta is a minimum sync time of the motor. The minimum sync time Ta may correspond with a minimum amount of time that must pass after startup for the motor to reach an acceptable level of synchronization before being reconfigured in synchronous mode. Further the timer is configured such that Tb is a maximum sync time of the motor. The maximum sync time Tb may be a maximum amount of time that can pass before the motor synchronization level has reached an acceptable level for reconfiguration from induction to synchronous mode. Time Ta must be less than time Tb. The logic 300 may be configured such that the processor cannot reconfigure the motor from induction to synchronous mode until time Ta has lapsed, and once time Tb has lapsed, the processor must reconfigure the motor from induction to synchronous mode. To that end, once the motor has started, timer 312 is initiated. Once time Ta has expired, but before time Tb has expired, 314 asserts high to AND gate 308. Thus, upon the synchronization reaching the predetermined threshold 304 and expiration of time Ta, AND gate 308 asserts to OR gate 318.

Upon expiration of time Tb, timer 316 asserts directly to OR gate 318. Thus, OR gate asserts upon either 1) expiration of time Ta (minimum time required for synchronization passes) and synchronization reaches the predetermined threshold 304; or, 2) expiration of time Tb (maximum time needed for synchronization). Assertion of OR gate 318 produces a signal for reconfiguration from induction mode to synchronous mode. That is, as illustrated in FIGS. 1 and 2, switch 114 is opened and switch 116 is closed.

FIG. 3B illustrates in more detail the calculation of synchronization 302 of FIG. 3A. Current signals 330A, 330B, and 330C are each used by the synchronization calculator 302, where root mean square ("RMS") values are determined for each phase in RMS calculators 352A, 352B, 352C. The RMS values from each phase are summed in adder 354. The sum is then reduced by ⅓ in 356. A DC component is calculated in 358 from the reduced sum of RMS values. The DC component is then subtracted from the reduced value in adder 360 to produce representative current values 362, which may be useful in calculating a rotational frequency of the rotor 362. The representative current values 362 may then be used to estimate a synchronization of the rotor.

The representative current values 362 are then processed to find a synchronization of the rotor. To that end, zero crossings of the values are found in 364 and N of the zero crossings are buffered in 366 along with the time associated with each particular value. Unexpected zero crossings are ignored in 368. Using the buffered zero crossings and ignoring unexpected zero crossings, synchronization is estimated 370, and the estimate 372 is output to comparator 306 (see FIG. 3A).

In one embodiment, synchronization may be the slip of the rotor. Returning to steps 364-370, slip may be estimated from the values 362. Slip may be calculated for each zero crossing using Equation 2:

$$\text{Slip\_temp}_k = 1 - \frac{FN - \frac{1}{2*2*\Delta t_k}}{FN} \qquad 2$$

where:
Slip_temp$_k$ is a temporary calculation of slip at time k;
FN is the fundamental frequency of the motor; and,
$\Delta t_k$ is the time between zero crossing at time k and the previous zero crossing.

The last N values of Slip_temp may be buffered in 366. Unexpected values of slip may be ignored. Equations 3-6 include examples of unexpected values of slip that may be ignored according to various embodiments:

$$\text{Slip\_temp}_k > 1.1 \qquad 3$$

$$\text{Slip\_temp}_k < 0 \qquad 4$$

$$\text{Slip\_temp}_k < \frac{\text{Slip\_temp}_{k-1}}{TH\_TL} \qquad 5$$

$$\text{Slip\_temp}_k > TH\_TH * \text{Slip\_temp}_{k-1} \qquad 6$$

where:
Slip_temp$_{k-1}$ is a temporary calculation of slip at time k−1;
TH_TL is a threshold; and
TH_TH is a threshold.

That is, the temporary value for slip at time k may be ignored when the value is greater than 1.1, or less than 0. The temporary value for slip at time k may also be ignored when the value at time k is less than 1/TH_TL of the temporary value of slip at time k−1. Finally, the temporary value for slip at time k may be ignored when the value is greater than a product of TH_TH and the temporary value of slip at time k−1. In one embodiment TH_TL may be selected as 4, and TH_TH may be selected as 2. Other conditions for determining which temporary values of slip may be used.

In various embodiments, past temporary values of slip may be used to calculate a final estimate of slip at time k. In one particular embodiment, a set of past temporary values of slip that are not ignored may be used in linear extrapolation to determine a final estimate of slip at time k. In other embodiments, polynomial extrapolation may use a set of past temporary values of slip that are not ignored to determine a final estimate of slip at time k.

The final estimate of slip at time k may be the estimated synchronization value 372 used by comparator 306. In this embodiment, the threshold 304 may be a slip threshold corresponding with a slip vale sufficiently close to synchronization for the motor to be reconfigured from induction startup mode to synchronous mode, as described in more detail herein.

Figure 4:
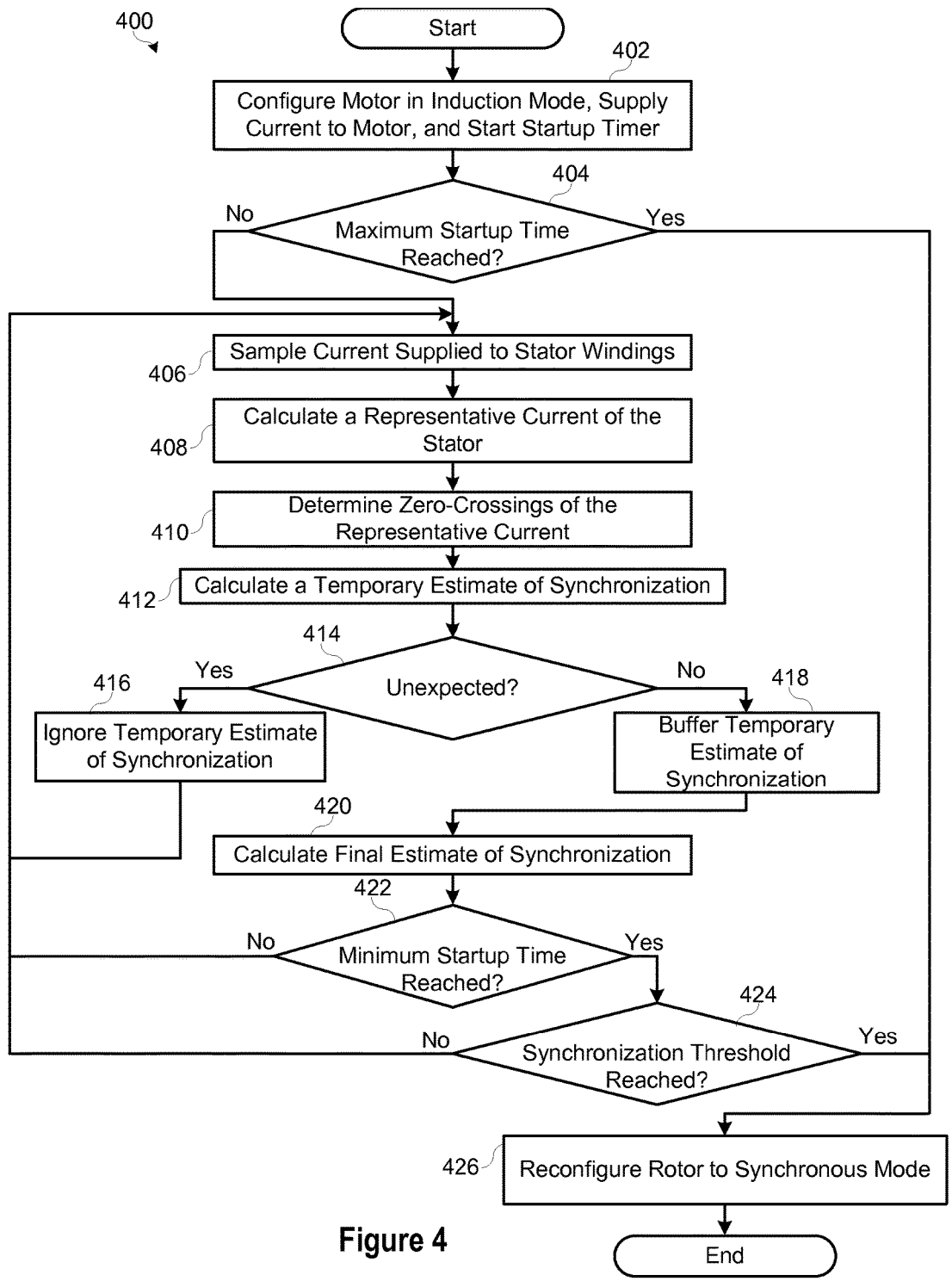
FIG. 4 illustrates a flow chart of a method for monitoring synchronization of a synchronous motor during startup in induction mode.

FIG. 4 illustrates a flow chart of a method 400 for using currents to monitor synchronization of a motor during startup. The method 400 starts with configuring the motor for startup in induction mode, supplying current to the motor, and starting a startup timer 402. That is, if the motor is a synchronous motor, the rotor may be configured to start in induction mode by closing the field winding with a discharge resistor, and disconnecting DC power from the field winding. Once the motor is configured in induction startup mode, electric power may be supplied to the stator windings, and the startup timer may be started.

The method may determine whether a maximum startup time has been reached 404. If the maximum startup time has been reached, then the method continues to reconfigure the rotor to synchronous mode 426, and ends.

Alternatively, if the maximum startup time has not been reached 404, then the method continues to sample current supplied to the stator windings 406. Representative current values may be calculated using the current samples 408. This calculation may include, as described above, calculating RMS values for each current phase, summing the RMS values, and subtracting therefrom a DC component calculated therefrom, to produce representative current values. In some embodiments, the summed RMS values may be divided by a factor such as three. The representative current values may be used to determine a rotational frequency of the rotor, and/or synchronization of the motor. Thus, a synchronization of the motor may be determined using only stator current values. That is, synchronization of the motor may be determined without using readings from the rotor such as a voltage across a discharge resistor of the field windings in induction mode. Accordingly, additional hardware such as the voltage measurement device does not need to be installed or monitored to determine a synchronization of the motor.

From this quantity, zero crossings of the quantity may be determined 410. With each zero crossing, a present temporary estimate of synchronization may be calculated 412. If the present temporary estimate is unexpected 414, then the present temporary estimate is ignored 416, and the method returns to step 406. If, however, the present temporary estimate is not unexpected 414, then the present temporary estimate is stored in a buffer of temporary estimates of synchronization 418.

The process continues from the determination of whether the value was unexpected 414 to monitor startup of the motor. According to the illustrated embodiment, the method proceeds to calculate a final estimate of synchronization 420. As described above, calculating the final estimate of synchronization 420 for time k may include an extrapolation using a set of previously calculated temporary estimates of synchronization from the buffer using linear, polynomial, or other extrapolation techniques.

The method may continue to determine whether the minimum startup time has been reached 422. If the minimum startup time has not been reached, then the method returns to continue sampling in step 404. However, if the minimum startup time has been reached 422, then the method determines whether the synchronization threshold has been reached 424. If the synchronization threshold has not been reached, then the method continues to obtain samples in step 406. However, if the synchronization threshold has been reached 424 and the minimum startup time has been reached 422 then the method reconfigures the rotor to synchronous mode 426, and ends.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. An intelligent electronic device ("IED") for monitoring synchronization of a motor using stator currents, comprising:
    an input in communication with current transformers ("CTs") each in electrical communication with a phase of current supplied to stator windings of the motor;
    a processor in communication with the input, receiving current data points corresponding with the current supplied to the stator windings; and,
    a non-transitory computer-readable storage medium in communication with the processor, the non-transitory computer-readable storage medium comprising:
        a synchronization module configured to
            calculate a root-mean squared value from the current data points for each phase of current supplied to the stator windings of the motor;
            sum the root-mean squared values from each phase;
            calculate a DC component from the sum of the root-mean squared values from each phase;
            calculate representative current values by subtracting the DC component from the sum of the root-mean squared values; and
            calculate using the representative current, and without using values from a voltage across a discharge resistor of field windings of the motor, an estimate of synchronization of
                a rotational frequency of the rotor
                a rotational frequency of an electric field of the stator windings of the motor; and
            control a configuration of the motor based on the estimate of synchronization by opening a switch to disconnect the discharge resistor from the field windings of the motor when the estimate of synchronization has reached a predetermined threshold.

2. The IED of claim 1, wherein the synchronization comprises one selected from the group consisting of: slip; and, a ratio of a rotational frequency of a rotor of the motor to a nominal frequency of the motor.

3. The IED of claim 1, wherein the motor comprises one selected from the group consisting of: a synchronous motor; and, an induction motor.

4. The IED of claim 1, wherein the synchronization module is further configured to:
    determine zero crossings using the representative current values; and,
    estimate a frequency of a rotor using the zero crossings.

5. The IED of claim 1, wherein the motor comprises a synchronous motor started in induction mode, and the synchronization module is further configured to reconfigure the motor from induction mode to synchronous mode when the synchronization reaches a predetermined threshold.

6. The IED of claim 1, wherein the synchronization module is further configured to calculate the estimate of synchronization without using values from a voltage of the field windings of the motor.

7. The IED of claim 6, wherein the synchronization module is further configured to calculate the estimate of synchronization without using voltage values.

8. The IED of claim 1, wherein the synchronization module is further configured to calculate the estimate of synchronization without using values from the field windings of the motor.

9. An intelligent electronic device ("IED") for monitoring synchronization of a motor using stator currents, comprising:
    an input in communication with current transformers ("CTs") each in electrical communication with a phase of current supplied to stator windings of the motor;
    a processor in communication with the input, receiving current data points corresponding with the current supplied to the stator windings; and,
    a non-transitory computer-readable storage medium in communication with the processor, the non-transitory computer-readable storage medium comprising:
        a synchronization module configured to:
            calculate a root-mean squared value from the current data points for each phase of current supplied to the stator windings of the motor;
            sum the root-mean squared values from each phase;
            calculate a DC component from the sum of the root-mean squared values from each phase;
            calculate representative current values by subtracting the DC component from the sum of the root-mean squared values;
            calculate using the representative current values, and without using values from a voltage across a discharge resistor of field windings of the motor, an estimate of synchronization of a rotational frequency of the rotor and a nominal frequency of the stator windings of the motor; and,
            reconfigure the motor from induction mode to synchronous mode when the synchronization reaches a predetermined threshold by signaling a switch to close to connect a power source to the field windings of the motor.

10. An intelligent electronic device ("IED") for monitoring synchronization of a motor using stator currents, comprising:
    an input in communication with current transformers ("CTs") each in electrical communication with a phase of current supplied to stator windings of the motor;
    a processor in communication with the input, receiving current data points corresponding with the current supplied to the stator windings; and,
    a non-transitory computer-readable storage medium in communication with the processor, the non-transitory computer-readable storage medium comprising:
        a synchronization module configured to:
            calculate root-mean squared current values from the plurality of current values from each phase;
            sum the root-mean squared current values from each phase;
            calculate a DC component from the sum of the root-mean squared current values;
            calculate representative current values by subtracting the DC component from the sum to produce representative current values;

calculate, using the representative current values and without using values from a voltage across a discharge resistor of field windings of the motor, an estimate of synchronization of a rotational frequency of the rotor and a nominal frequency of the stator windings of the motor; and control a configuration of the motor based on the estimate of synchronization by signaling a switch to open to disconnect the discharge resistor from the field windings of the motor when the estimate of synchronization has reached a predetermined threshold.

11. The IED of claim 10, wherein the synchronization module is further configured to reconfigure the motor from induction mode to synchronous mode when the synchronization reaches a predetermined threshold.

* * * * *